(12) United States Patent
Honda et al.

(10) Patent No.: US 8,896,369 B2
(45) Date of Patent: Nov. 25, 2014

(54) SWITCHING DEVICE (71) Applicant: Panasonic Corporation, Osaka (JP)

(72) Inventors: Yosiaki Honda, Kyoto (JP); Yuichi Inaba, Osaka (JP)

(73) Assignee: Panasonic Coporation, Osaka (JP)

( * ) Notice: Subject to any disclaimer, the term of this patent is extended or adjusted under 35 U.S.C. 154(b) by 37 days.

(21) Appl. No.: 13/802,743

(22) Filed: Mar. 14, 2013

(65) Prior Publication Data

US 2014/0266411 A1    Sep. 18, 2014

(51) Int. Cl.
*G05F 1/10* (2006.01)
*H03K 17/22* (2006.01)

(52) U.S. Cl.
CPC .................................. *H03K 17/223* (2013.01)
USPC ........................................................ 327/537

(58) Field of Classification Search
USPC ........................................ 327/530, 534–543
See application file for complete search history.

(56) References Cited

U.S. PATENT DOCUMENTS

| | | | |
|---|---|---|---|
| 8,076,698 B2 * | 12/2011 | Ueda et al. | 257/194 |
| 2010/0097105 A1 | 4/2010 | Morita et al. | |
| 2011/0215379 A1 | 9/2011 | Ikoshi et al. | |

FOREIGN PATENT DOCUMENTS

| | | |
|---|---|---|
| JP | 2009-060049 | 3/2009 |
| JP | 2010-176885 | 8/2010 |

* cited by examiner

*Primary Examiner* — Sibin Chen
(74) *Attorney, Agent, or Firm* — Panasonic Patent Center (57) ABSTRACT

The present invention provides a switching device capable of further minimizing the ON resistance of a switching element. Switching element has hole injecting unit that includes injecting electrode which is directly connected to semiconductor substrate. Injection driving unit of driving unit is connected to injecting electrode and source electrode of switching element, and applies an injection voltage Vin between injecting electrode and source electrode. Injection driving unit injects holes from hole injecting unit to a hetero-junction interface of semiconductor substrate, by applying the injection voltage Vin exceeding a threshold value to switching element. Because the injected holes pull the equivalent amount of electrons to the hetero-junction interface, concentration of the 2-dimensional electron gas as the channel region becomes high, and the ON resistance of switching element 10 becomes small.

13 Claims, 11 Drawing Sheets

SWITCHING DEVICE

BACKGROUND

1. Technical Field

The present invention relates to a switching device that has a switching element made of a semiconductor element.

2. Background Art

Conventionally, there has been provided a switching device that has a switching element being a contactless switching element such as a triac, a thyristor, and a field-effect transistor (FET), and is configured to turn off and on (non-conduction and conduction) the switching element. This switching device performs a switching of power to be supplied from a power supply to a load, by having the switching element inserted between the load and the power supply of an illumination device or the like, for example.

In recent years, as a switching element that is used in this type of a switching device, attention is being focused on a semiconductor element that uses a nitride semiconductor such as gallium nitride (GaN) and a wide band-gap semiconductor such as silicon carbide (SiC). As an example of this type of a semiconductor element, there is an element that uses a 2-dimensional electron gas layer generated in an AlGaN/GaN hetero-interface as a channel layer (for example, see Unexamined Japanese Patent Publication No. 2010-176885; hereinafter, Patent Document 1).

According to the switching element described in Patent Document 1, a GaN layer and an AlGaN layer are stacked, and a first electrode, a second electrode, and an intermediate-potential part are formed on the surface of the AlGaN layer. Further, a gate (control electrode) is formed on the intermediate-potential part. Based on this configuration, in the switching element, a current flowing in the path between the first electrode and the second electrode changes, by a gate voltage (control signal) applied to the gate, in a state of a voltage being applied between the first electrode and the second electrode. In short, this switching element constitutes a normally-off type switching element in which the current path between the first electrode and the second electrode becomes non-conductive when the gate voltage becomes lower than a predetermined threshold value, and the current path between the first electrode and the second electrode becomes conductive when the gate voltage exceeds the threshold value.

A switching device that uses the switching element of the above configuration can minimize an ON resistance as an electric resistance that is present in the current path in the conductive state, as compared with the case of using a MOS-FET (Metal-Oxide-Semiconductor FET), an IGBT (Insulated-Gate-Bipolar-Transistor), and the like.

SUMMARY

However, the configuration described in Patent Document 1 sometimes has a problem in that a loss occurs in the switching element when the voltage applied to the switching element is relatively high or when the current flowing in the switching element is relatively large. Therefore, it is desired to further minimize the ON resistance of the switching element.

The present invention has been achieved in view of the above problems, and an object of the present invention is to provide a switching device capable of further minimizing the ON resistance of the switching element.

The switching device of the present invention has a semiconductor substrate, a first electrode and a second electrode that are disposed on one surface of the semiconductor substrate, and a gate unit that is disposed between the first electrode and the second electrode on the one surface. The switching device has a switching element that makes a portion between the first electrode and the second electrode conductive by forming a channel region on the semiconductor substrate, when a gate voltage that exceeds a predetermined threshold value is applied to the gate unit, and a drive circuit that switches between ON and OFF of the switching element by applying the gate voltage to the gate unit of the switching element. The semiconductor substrate has a semiconductor-stacked body that is formed by stacking a first semiconductor layer and a second semiconductor layer and has a hetero-junction interface at a junction portion between the first semiconductor layer and the second semiconductor layer, and a 2-dimensional electron gas layer generated in the hetero-junction interface is used as the channel region. The switching element has a hole injecting unit that has an injecting electrode directly connected to the semiconductor substrate, and the drive circuit has an injection driving unit that injects holes from the hole injecting unit into the hetero-junction interface by applying an injection voltage to the injecting electrode.

In this switching device, preferably, the injection driving unit injects holes into the hetero-junction interface by applying the injection voltage to the injecting electrode, during an ON time of the switching element.

In this switching device, more preferably, the drive circuit has a voltage monitoring unit that measures a voltage applied between the first electrode and the second electrode of the switching element, as a device voltage, and the injection driving unit adjusts a magnitude of the injection voltage according to a measured value of the voltage monitoring unit.

In this switching device, more preferably, the injection driving unit injects holes into the hetero-junction interface by applying the injection voltage to the injecting electrode, during a reset period that is set before a time point when the switching element is turned ON.

In this switching device, more preferably, the switching element has a pair of the gate units, and the injection driving unit uses a high-potential-side gate unit out of the pair of gate units, for the hole injecting unit.

In this switching device, more preferably, the hole injecting unit is provided in a plural number.

In this switching device, more preferably, the injecting electrode is provided on the other surface at the opposite side of the one surface of the semiconductor substrate.

In this switching device, more preferably, the injecting electrode is disposed at a position of the other surface excluding a position at which the injecting electrode is superposed with the gate unit in a thickness direction of the semiconductor substrate.

In this switching device, more preferably, the other surface of the semiconductor substrate is provided with a substrate electrode that determines a potential of the semiconductor substrate, separately from the injecting electrode.

In this switching device, more preferably, the hole injecting unit is disposed between a high-potential-side electrode out of the first electrode and the second electrode, and the gate unit.

In this switching device, more preferably, the gate unit is provided in a pair, and the hole injecting unit is disposed between the pair of gate units.

In this switching device, more preferably, the hole injecting unit has a p-type semiconductor layer.

In this switching device, more preferably, the injection driving unit has an insulation-type power supply circuit of which a portion between an input end and an output end is electrically insulated, and applies the injection voltage, from the output end of the power supply circuit to the injecting electrode, following an injection signal that is applied to the input end of the power supply circuit.

The present invention has an advantage in that the ON resistance of the switching element can be further minimized, because the injection driving unit injects the holes from the hole injecting unit into the hetero-junction interface by applying the injection voltage to the injecting electrode.

DETAILED DESCRIPTION OF THE PREFERRED EMBODIMENTS

First Exemplary Embodiment

Figure 1:
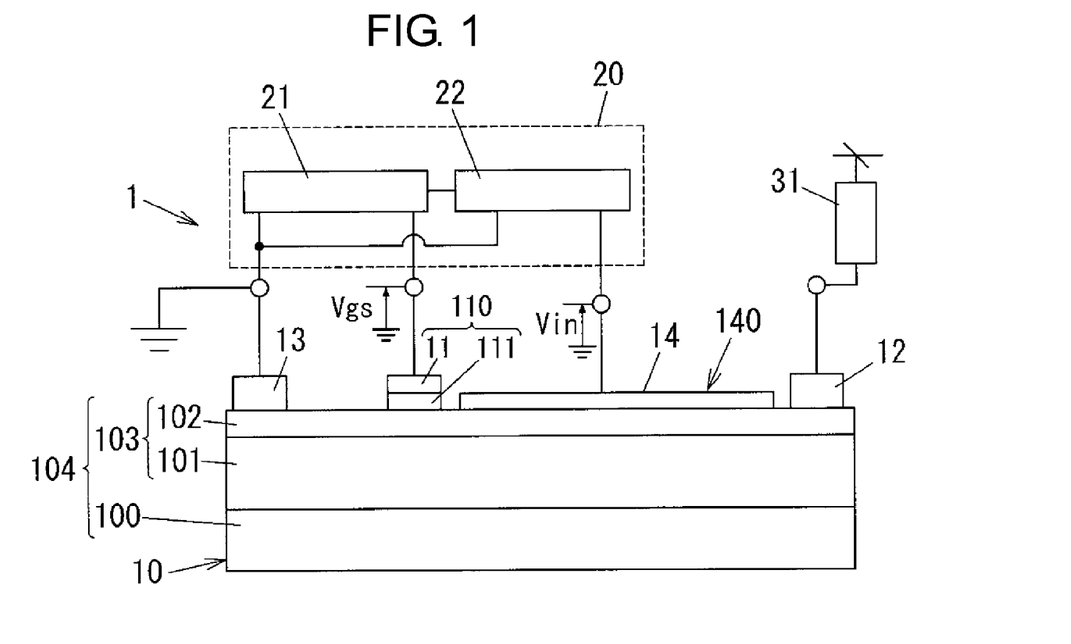
FIG. 1 is an explanatory diagram showing a schematic configuration of a switching device according to a first embodiment.

Switching device 1 according to the present embodiment has switching element 10 made of a semiconductor element, and drive circuit 20 that switches between a conduction (ON) and a block (OFF) of switching element 10 by applying a gate voltage to switching element 10, as shown in FIG. 1. In the example of FIG. 1, switching device 1 is used to switch supply power from a direct-current power supply (not shown) to load (electric device or the like) 31, and has switching element 10 that is inserted between the direct-current power supply and load 31.

Switching element 10 includes a field-effect transistor (FET) that has gate electrode 11, drain electrode 12 as a first electrode, and source electrode 13 as a second electrode. While a detailed configuration is described later, switching element 10 is made of an element that uses materials of a nitride semiconductor such as gallium nitride (GaN), and a wide band-gap semiconductor such as silicon carbide (SiC). The wide band-gap refers to a band gap (at least 2.2 eV) that is two times the band gap (1.1 eV) of silicon (Si) or larger, for example. With this arrangement, switching element 10 can realize a high withstand-voltage power device that has a relatively low ON resistance as an electric resistance existing in a current path in a conductive (ON) state and that can be also adapted to a large current. The wide band-gap semiconductor in this case is defined as a semiconductor that has a light element of the second period in the periodic table as a constituent element, for example.

Switching element 10 is connected to load 31 and the direct-current power supply such that a current path between drain electrode 12 and source electrode 13 is inserted into a series circuit of load 31 and the direct-current power supply. In this example, drain electrode 12 is connected to a positive electrode side of the direct-current power supply, and source electrode 13 is connected to a negative electrode side.

Drive circuit 20 switches between a conduction and a block of the current path between drain electrode 12 and source electrode 13 by applying a gate voltage Vgs between gate electrode 11 and source electrode 13. Switching element 10 constitutes a switch that blocks the current path between drain electrode 12 and source electrode 13 when the gate voltage Vgs becomes lower than a predetermined threshold value and that conducts the current path between drain electrode 12 and source electrode 13 when the gate voltage Vgs exceeds the threshold value. Therefore, switching element 10 constitutes a normally-off type switch when the threshold value is equal to or higher than 0 V, and constitutes a normally-on type switch when the threshold value is smaller than 0 V. Hereinafter, a case where switching element 10 constitutes the normally-off type switch is explained.

Drive circuit 20 has gate driving unit 21 that applies the gate voltage Vgs to switching element 10, and injection driving unit 22 that injects a injection voltage to injecting electrode 14 described later. Gate driving unit 21 and injection driving unit 22 each consists of a direct-current voltage source of which a magnitude of an output voltage is variable. Gate driving unit 21 is connected to gate electrode 11 and source electrode 13, and applies the gate voltage Vgs exceeding the threshold value to switching element 10 such that switching element 10 is turned ON during an "H" level period of an ON/OFF signal, upon receiving the ON/OFF signal from outside. The gate voltage Vgs is a direct-current voltage, with source electrode 13 set at a reference potential (negative electrode) and gate electrode 11 set as a positive electrode. Injection driving unit 22 is described in detail later.

Figure 2A:
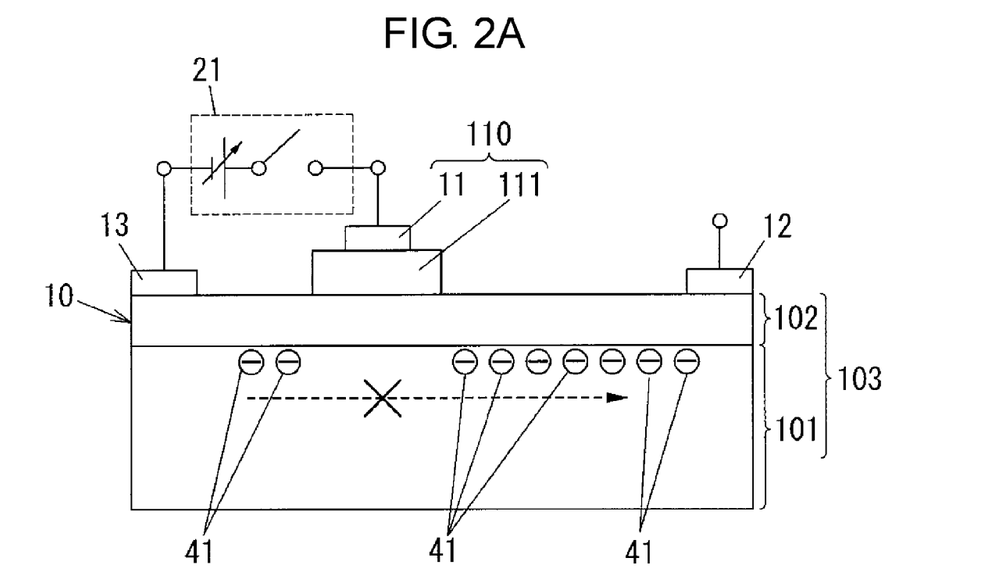
FIG. 2A is an explanatory diagram showing an operation of a switching element used in the switching device according to the first embodiment.
Figure 2B:
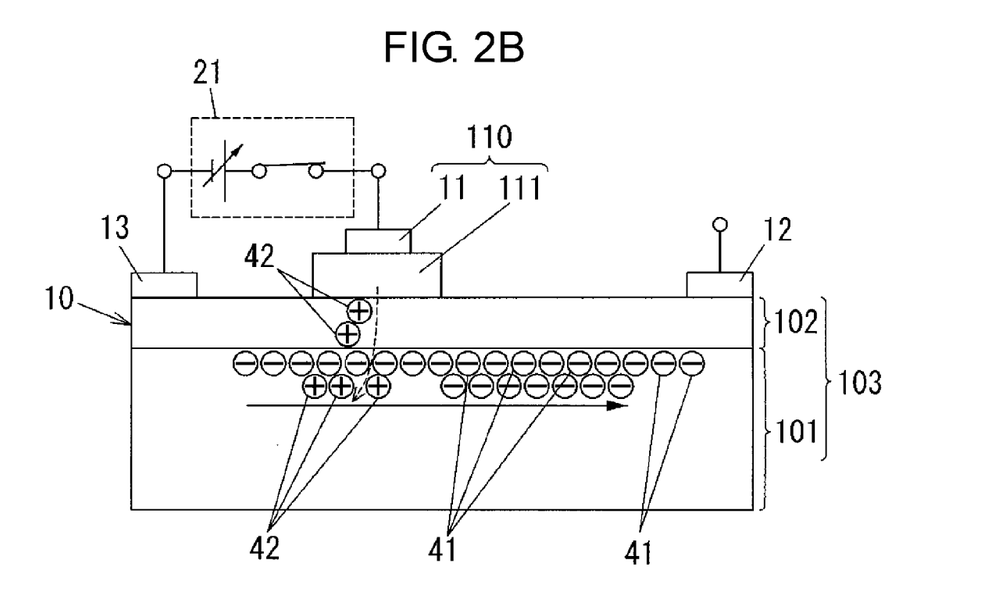
FIG. 2B is an explanatory diagram showing the operation of the switching element used in the switching device according to the first embodiment.

A basic configuration and an operation of switching element 10 according to the present embodiment are briefly explained next with reference to FIGS. 2A and 2B. In FIGS. 2A and 2B, gate driving unit 21 is expressed as an equivalent circuit of a power supply and a switch, and a supporting substrate and the like are suitably omitted from the drawings.

Switching element 10 has semiconductor-stacked body 103 that is formed on supporting substrate 100 (see FIG. 1) made of silicon (Si), with a buffer layer (not shown) interposed therebetween. Semiconductor-stacked body 103 is configured by having first semiconductor layer 101 and second semiconductor layer 102 stacked in this order from a supporting substrate 100 side, first semiconductor layer 101 being made of an undoped GaN layer, and second semiconductor layer 102 being made of an undoped AlGaN layer. Semiconductor-stacked body 103 constitutes semiconductor substrate 104 (see FIG. 1), together with supporting substrate 100 and the buffer layer. However, it suffices that semiconductor substrate 104 (see FIG. 1) has an active layer in which a channel region for causing electrons to move is included, and only semiconductor-stacked body 103 may be sufficient for semiconductor substrate 104.

Further, switching element 10 has control layer 111 that is formed at a part on second semiconductor layer 102. Control layer 111 consists of impurity-doped p-type AlGaN. Gate electrode 11 made of a metal material is stacked on control layer 111, and gate electrode 11 is in ohmic-junction with control layer 111. Gate electrode 11 and control layer 111 constitute gate unit 110.

Drain electrode 12 and source electrode 13 are formed by being isolated from each other at positions sandwiching control layer 111 on second semiconductor layer 102. That is, gate unit 110 is formed between drain electrode 12 and source electrode 13, on second semiconductor layer 102. In this example, gate unit 110 is disposed at a position near source electrode 13 instead of an intermediate position between drain electrode 12 and source electrode 13. In this way, a distance between gate unit 110 and drain electrode 12 is set larger than a distance between gate unit 110 and source electrode 13 for the purpose of securing a sufficient withstand voltage between gate unit 110 and drain electrode 12 of switching element 10.

In this case, a band gap of second semiconductor layer 102 is set larger than a band gap of first semiconductor layer 101, and a hetero barrier is formed in the interface of first semiconductor layer 101 and second semiconductor layer 102. Near the hetero-junction interface of first semiconductor layer 101 and second semiconductor layer 102, a high-concentration 2-dimensional electron gas (2DEG) layer that becomes a channel region during an operation is formed by an influence of intrinsic polarization and piezoelectric polarization.

That is, first semiconductor layer 101 is formed with the channel region in which electrons move along the interface with second semiconductor layer 102, even when an impurity is not being doped with. Both drain electrode 12 and source electrode 13 are in ohmic-junction with the 2-dimensional electron gas layer, and gate electrode 11 is in ohmic-junction with control layer 111.

Based on the above configuration, when the gate voltage Vgs changes in a state of a voltage being applied between drain electrode 12 and source electrode 13, switching element 10 has the drain current flowing between drain electrode 12 and source electrode 13 changed in the principle explained below.

That is, when the gate voltage Vgs is 0 V, in switching element 10, the channel region immediately below gate unit 110 shown in FIG. 2A is depleted, and the drain current does not flow because the current path between drain electrode 12 and source electrode 13 is blocked. The depletion of the channel region occurs due to increase of a potential in the channel region by p-type control layer 111 that is formed between gate electrode 11 and second semiconductor layer 102. That is, when the gate voltage Vgs is 0 V, the 2-dimensional electron gas in the channel region is offset by holes, and a normally-off characteristic is realized.

On the other hand, when the gate voltage Vgs exceeds the predetermined threshold value, in switching element 10, the current path between drain electrode 12 and source electrode 13 becomes conductive as shown in FIG. 2B, and the drain current flows. That is, in switching element 10, when the gate voltage Vgs exceeding the threshold value is applied from drive circuit 20, the potential in the channel region immediately below gate unit 110 decreases. Then, electrons 41 are generated in the channel region, and the current path becomes conductive.

In the present embodiment, the threshold value of the gate voltage Vgs is set in a forward-on-voltage of a pn-junction that is formed between control layer 111 and the channel region. When the gate voltage Vgs exceeds the threshold value, holes 42 are injected from gate unit 110 into the channel region. At this time, because of existence of the potential barrier of the hetero-junction, few electrons 41 flow to gate unit 110, but electrons 41 of the equivalent amount of injected holes 42 are pulled to the hetero-junction interface. Generated electrons 41 move at high speeds toward drain electrode 12 by a drain voltage Vds. On the other hand, mobility of holes 42 in first semiconductor layer 101 is extremely small as compared with mobility of electrons 41, and therefore, most of holes 42 stay near gate unit 110. Therefore, holes 42 further generate the equivalent amount of electrons 41 and increase electrons 41 in the channel region.

Switching device 1 can minimize the ON resistance as the electric resistance that is present in the current path in the conductive (ON) state, as compared with the case of using a MOSFET, an IGBT, and the like by using switching element 10 of the above configuration.

Semiconductor materials that constitute first semiconductor layer 101, second semiconductor layer 102, and control layer 111 are not limited to nitride semiconductors, and may be silicon carbide (SiC) and the like, for example. Although switching element 10 employs a configuration having gate electrode 11 in ohmic-junction with control layer 111, the configuration is not limited to this, and gate electrode 11 may be in Schottky-junction with second semiconductor layer 102.

In switching device 1 of the present embodiment, switching element 10 has hole injecting unit 140 having injecting electrode 14 that is directly connected to semiconductor substrate 104 as shown in FIG. 1. In this example, hole injecting unit 140 is configured by only injecting electrode 14. Hole injecting unit 140 injects holes into a hetero-junction interface (that is, an interface of first semiconductor layer 101 and second semiconductor layer 102) in semiconductor substrate 104, by having the injection voltage Vin exceeding a predetermined threshold value applied to injecting electrode 14. The threshold value of the injection voltage Vin is set separately from the threshold value of the gate voltage Vgs.

Injecting electrode 14 is made of a metal material, and is formed on one surface of semiconductor substrate 104 on which drain electrode 12, source electrode 13, and gate unit 110 are formed. That is, injecting electrode 14 is disposed at a position not interfering with any one of drain electrode 12, source electrode 13, and gate unit 110, on second semiconductor layer 102. In the example of FIG. 1, injecting electrode 14 is disposed between high-potential-side drain electrode 12 out of drain electrode 12 and source electrode 13, and gate unit 110. Injecting electrode 14 is in ohmic-junction with second semiconductor layer 102 that forms the 2-dimensional electron gas layer.

Injection driving unit 22 of drive circuit 20 is connected to injecting electrode 14 and source electrode 13 of switching element 10, and applies the injection voltage Vin between injecting electrode 14 and source electrode 13. Injection driving unit 22 injects holes into the hetero-junction interface of semiconductor substrate 104 from hole injecting unit 140, by applying the injection voltage Vin exceeding the threshold value to switching element 10. The injection voltage Vin is a direct-current voltage, with source electrode 13 set at a reference potential (negative electrode) and injecting electrode 14 set as a positive electrode.

Figure 3:
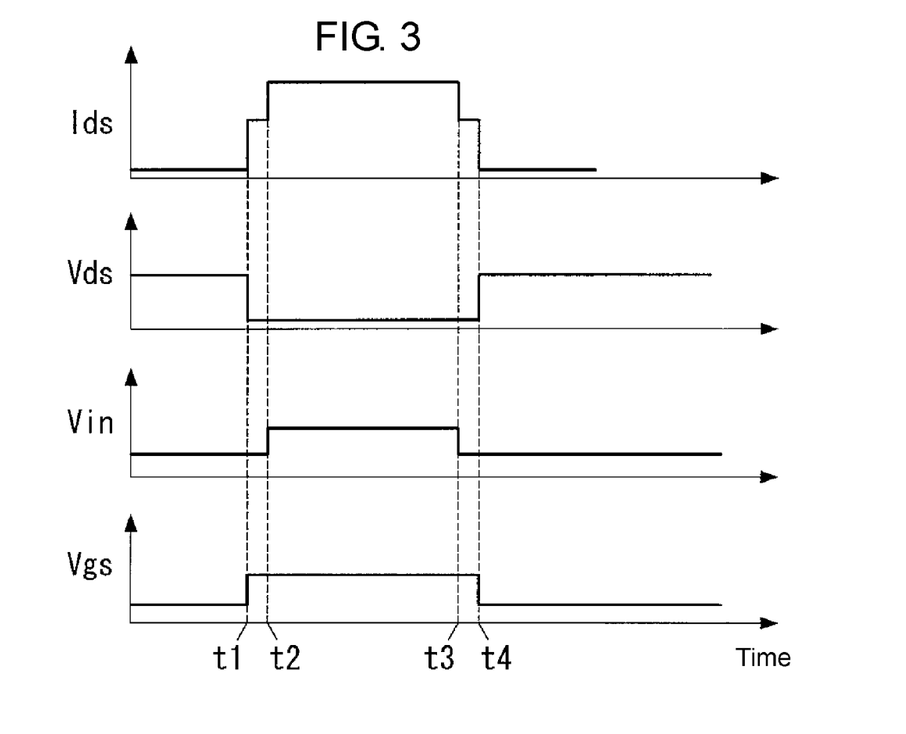
FIG. 3 is a graph showing a drain current Ids, a drain voltage Vds, a injection voltage Vin, and a gate voltage Vgs in the operation of the switching device according to the first embodiment.

In the present embodiment, injection driving unit 22 determines an application timing of the injection voltage Vin, by matching with an application timing of the gate voltage Vgs by gate driving unit 21. Specifically, injection driving unit 22 injects holes into the hetero-junction interface by applying the injection voltage Vin to injecting electrode 14, during the ON time of switching element 10, with the gate voltage Vgs being applied, as shown in FIG. 3. FIG. 3 is a graph showing a drain current Ids that flows between drain electrode 12 and source electrode 13, the drain voltage Vds that is applied between drain electrode 12 and source electrode 13, the injection voltage Vin and the gate voltage Vgs.

That is, injection driving unit 22 applies the injection voltage Vin exceeding the threshold voltage to switching element 10, during a period from t2 to t3 that is set to be superposed with a period from t1 to t4 during which gate driving unit 21 applies the gate voltage Vgs exceeding the threshold value to switching element 10. In this case, it suffices that the period from t2 to t3 during which injection driving unit 22 applies the injection voltage Vin is included in the period from t1 to t4 during which gate driving unit 21 applies the gate voltage Vgs, and t2 may be equal to t1, and t3 may be equal to t4.

When the injection voltage Vin is applied to injecting electrode 14 during an ON time of switching element 10, the ON resistance of switching element 10 becomes small and the drain current Ids (FIG. 3) becomes large even when the drain voltage Vds (FIG. 3) is constant, in the principle explained below.

That is, hole injecting unit 140 injects holes into the hetero-junction interface of semiconductor substrate 104 when the injection voltage Vin is applied on injecting electrode 14 during the ON time of switching element 10. At this time, because of existence of the potential barrier of the hetero-junction, few electrons flow to hole injecting unit 140, but electrons of the equivalent amount of injected holes are pulled to the hetero-junction interface. Generated electrons move at high speeds toward drain electrode 12 by the drain voltage Vds. On the other hand, mobility of holes in first semiconductor layer 101 is extremely small as compared with mobility of electrons, and therefore, most of holes stay near hole injecting unit 140. Therefore, holes further generate the equivalent amount of electrons and increase electrons in the channel region. In other words, because concentration of the 2-dimensional electron gas as the channel region becomes high, the ON resistance of switching element 10 becomes small.

In short, the holes injected from hole injecting unit 140 work to increase the electron concentration in the channel region and decrease the ON resistance of switching element 10, in the principle similar to that of the holes injected from gate unit 110. As a result, in the period from t2 to t3 during which the injection voltage Vin is being applied to injecting electrode 14 in an ON state of switching element 10, the drain current Ids (FIG. 3) becomes large even when the drain voltage Vds (FIG. 3) is constant, and a loss generated in switching element 10 becomes small.

Injection driving unit 22 may also have an insulation-type power supply circuit (not shown) of which a portion between an input end and an output end is electrically insulated. In this case, injection driving unit 22 applies the injection voltage Vin between injecting electrode 14 and source electrode 13 from the output end of the power supply circuit, following an injection signal applied to the input end of the power supply circuit. The injection signal applied to the input end of the power supply circuit is a signal for controlling the application timing of the injection voltage Vin, and is generated by a control unit (not shown) that integrally controls gate driving unit 21 and injection driving unit 22. While the explanation of a detailed configuration is omitted, the insulation-type power supply circuit is formed by a flyback converter using a flyback transformer, for example.

According to switching device 1 of the present embodiment explained above, there is an advantage in that the ON resistance of switching element 10 can be further minimized, as compared with a configuration not having hole injecting unit 140. That is, when injection driving unit 22 applies the injection voltage Vin to injecting electrode 14 during the ON time of switching element 10, the concentration of the 2-dimensional electron gas as the channel region becomes high because the holes are injected from hole injecting unit 140 into the hetero-junction interface. As a result, the ON resistance of switching element 10 becomes small.

Further, in the present embodiment, hole injecting unit 140 (injecting electrode 14) is disposed between drain electrode 12 and gate unit 110, on the same surface as drain electrode 12 and the like on semiconductor substrate 104. Therefore, the holes to be released from hole injecting unit 140 to semiconductor substrate 104 during the application of the injection voltage Vin are injected to a portion corresponding to between drain electrode 12 and gate unit 110 out of the hetero-junction interface of semiconductor substrate 104. Accordingly, switching element 10 can minimize the ON resistance by increasing electrons at the portion corresponding to between drain electrode 12 and gate unit 110 in the channel region, while realizing the high withstand voltage by securing a large distance between drain electrode 12 and gate unit 110. Because the holes are injected from gate unit 110 into the channel region immediately below gate unit 110, switching element 10 has the 2-dimensional electron gas in high concentration in a large portion of the channel region ranging from immediately below gate unit 110 to drain electrode 12.

Figure 4:
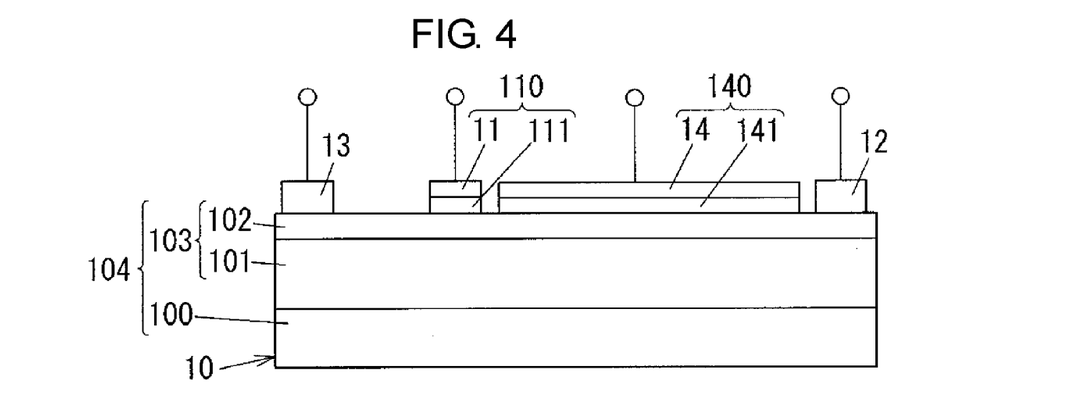
FIG. 4 is an explanatory diagram of other configuration of the switching element used in the switching device according to the first embodiment.

Further, hole injecting unit 140 may have a p-type semiconductor layer. That is, as shown in FIG. 4, with p-type semiconductor layer 141 formed on second semiconductor layer 102, injecting electrode 14 may constitute hole injecting unit 140 together with p-type semiconductor layer 141 by being stacked on this p-type semiconductor layer 141. P-type semiconductor layer 141 consists of an impurity-doped p-type AlGaN in a similar manner to that of control layer 111, for example, and injecting electrode 14 becomes in ohmic-junction with p-type semiconductor layer 141.

In the present configuration, the threshold value of the injection voltage Vin is set in a forward-on-voltage of a pn-junction that is formed between p-type semiconductor layer 141 and the channel region. When the injection voltage Vin exceeds the threshold value, holes are injected from p-type semiconductor layer 141 of hole injecting unit 140 into the channel region. When hole injecting unit 140 has the same layer-configuration as that of gate unit 110, switching element 10 can have the channel region immediately below hole injecting unit 140 depleted, because p-type semiconductor layer 141 increases the potential in the channel region. Therefore, the withstand voltage between drain electrode 12 and source electrode 13 during an OFF time of switching element 10 can be increased. On the other hand, switching element 10 can have the portion immediately below hole injecting unit 140 not depleted, by setting hole injecting unit 140 to have a layer configuration different from that of gate unit 110 by changing the thickness of second semiconductor layer 102 and aluminum mol concentration in p-type semiconductor layer 141 and the like.

Hole injecting unit 140 may be provided between gate unit 110 and source electrode 13, instead of between drain electrode 12 and gate unit 110. Further, hole injecting unit 140 may be provided in a plural number. For example, hole injecting unit 140 may be provided both between drain electrode 12 and gate unit 110 and between gate unit 110 and source electrode 13, or hole injecting unit 140 may be provided in a plural number between drain electrode 12 and gate unit 110. When hole injecting unit 140 is provided in a plural number, injection driving unit 22 can inject holes from plural hole injecting units 140 to semiconductor substrate 104, by applying the injection voltage Vin to plural injecting electrodes 14. Therefore, concentration of the 2-dimensional electron gas becomes high at plural positions in the channel region, and switching device 1 can further minimize the ON resistance of switching element 10.

Switching element 10 used in switching device 1 may be in a dual-gate structure having a pair of gate units 110 provided between drain electrode 12 and source electrode 13 on semiconductor substrate 104. Switching element 10 in the dual-gate structure is equivalent to a circuit having two transistors connected in series so as to connect between drain electrodes, and constitutes a bidirectional switch capable of switching a current flowing in both directions between drain electrode 12 and source electrode 13.

Figure 5A:
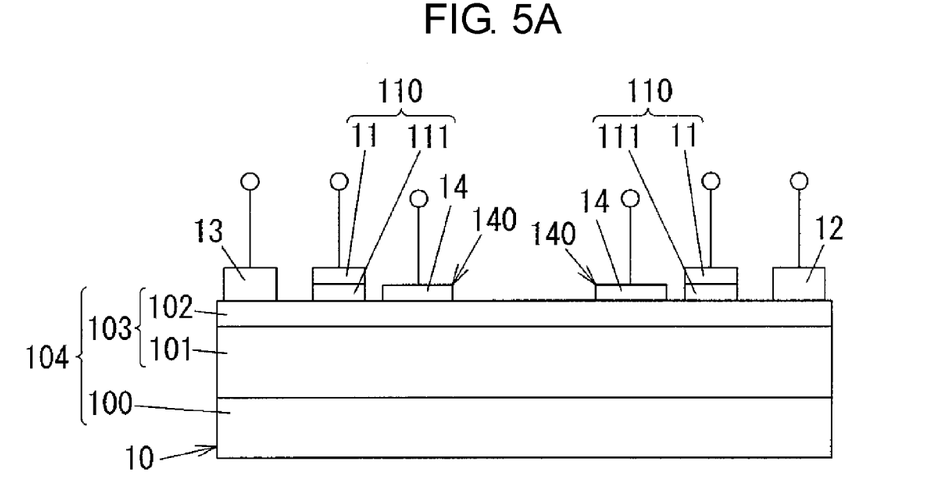
FIG. 5A is an explanatory diagram of other configuration of the switching element used in the switching device according to the first embodiment.
Figure 5B:
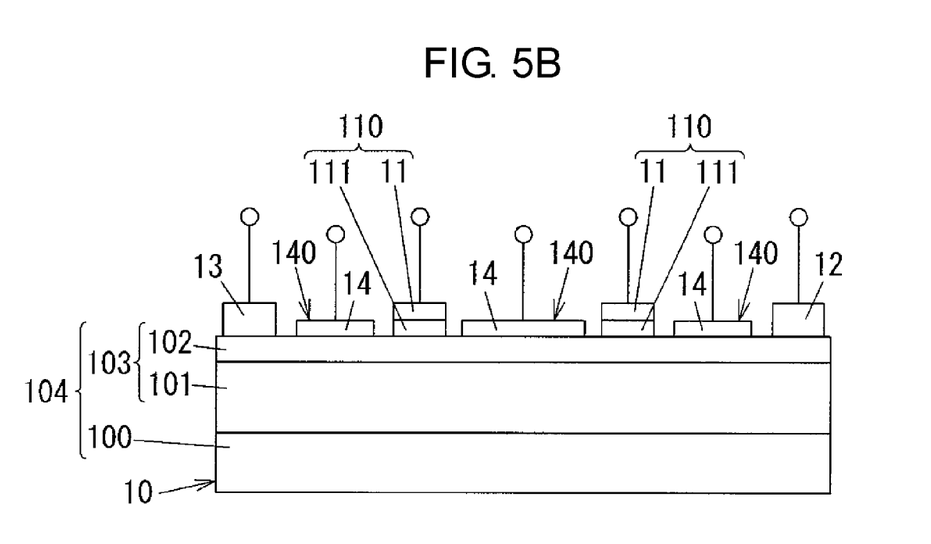
FIG. 5B is an explanatory diagram of other configuration of the switching element used in the switching device according to the first embodiment.

In switching element 10 of the dual-gate structure, hole injecting unit 140 is disposed as exemplified in FIGS. 5A and 5B, for example. In the example of FIG. 5A, two hole injecting unit 140 are provided, and each hole injecting unit 140 is disposed at a position adjacent to each gate unit 110 between the pair of gate units 110 on second semiconductor layer 102. In this case, injection driving unit 22 sets the injection voltage Vin to be applied to injecting electrode 14 at a source electrode 13 side, based on a potential of source electrode 13, and sets the injection voltage Vin to be applied to injecting electrode 14 at a drain electrode 12 side, based on the potential of drain electrode 12. In the example of FIG. 5B, three hole injecting units 140 are provided, and hole injecting units 140 are provided between gate electrode 110 and drain electrode 12 at one side, between gate electrode 110 and source electrode 13 at the other side, and between both gate electrodes 110, respectively, on second semiconductor layer 102.

Figure 6:
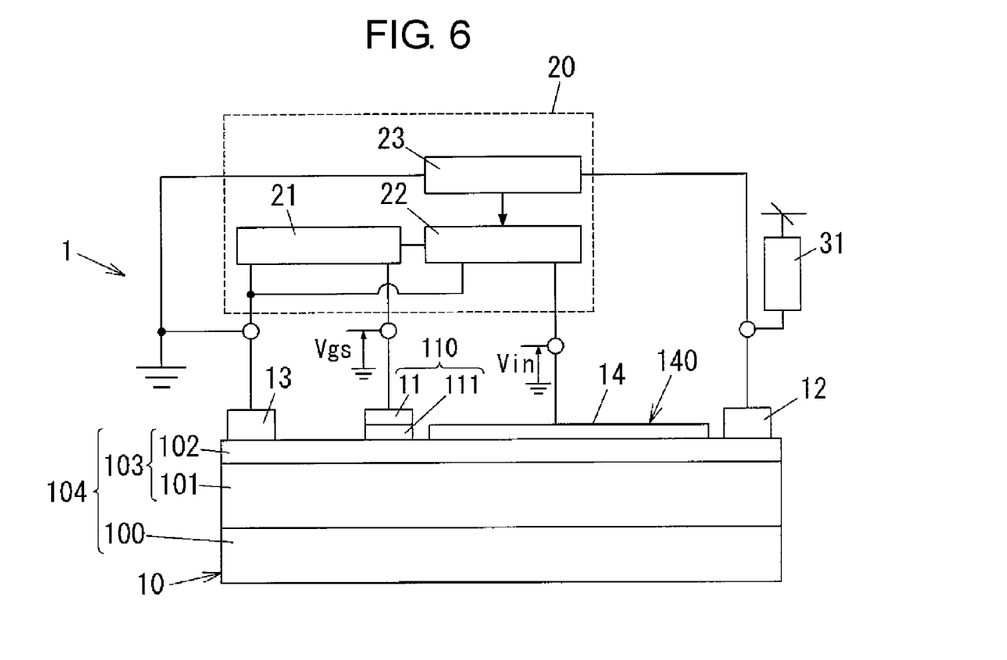
FIG. 6 is an explanatory diagram of other configuration of the switching device according to the first embodiment.

As other example of the present embodiment, drive circuit 20 may be configured to have voltage monitoring unit 23 that measures the drain voltage Vds as shown in FIG. 6, and injection driving unit 22 may adjust a magnitude of the injection voltage Vin according to a measured value of voltage monitoring unit 23. Voltage monitoring unit 23 is connected to drain electrode 12 and source electrode 13 of switching element 10, measures the drain voltage Vds as a device voltage applied between both ends (between drain electrode 12 and source electrode 13) of switching element 10, and inputs the measured value to injection driving unit 22. Injection driving unit 22 adjusts the magnitude of the injection voltage Vin according to the magnitude of the drain voltage Vds that is input from voltage monitoring unit 23, such that the injection voltage Vin becomes larger when the drain voltage Vds becomes larger.

According to this configuration, switching device 1 can cause switching element 10 to operate in a state suitable for the magnitude of the drain voltage Vds, because the number of holes injected from hole injecting unit 140 into the hetero-junction interface changes depending on the magnitude of the drain voltage Vds. That is, when the drain voltage Vds is relatively small, switching device 1 can minimize power consumption of injection driving unit 22 by decreasing the magnitude of holes injected from hole injecting unit 140. On the other hand, when the drain voltage Vds is relatively large, switching device 1 can further minimize the ON resistance of switching element 10 by increasing the magnitude of holes injected from hole injecting unit 140. Therefore, power loss of switching element 10 can be minimized.

Second Exemplary Embodiment

Switching device 1 in the present embodiment is different from switching device 1 in the first embodiment in that the timing of application of the injection voltage Vin to injecting electrode 14 by injection driving unit 22 is different from the application timing in the first embodiment. Hereinafter, configurations similar to those in the first embodiment are assigned with common marks, and their explanations are suitably omitted.

In the present embodiment, injection driving unit 22 injects holes into the hetero-junction interface by applying the injection voltage Vin to injecting electrode 14, during a reset period that is set before a time point when the switching element 10 is turned ON triggered by start of application of the gate voltage Vgs by gate driving unit 21. Specifically, injection driving unit 22 applies the injection voltage Vin, triggered by the change of an ON/OFF signal from an "L" level to an "H" level, simultaneously with or immediately before the application of the gate voltage Vgs by gate driving unit 21. A length of the reset period when injection driving unit 22 applies the injection voltage Vin is suitably set.

In this way, injection driving unit 22 injects holes from hole injecting unit 140 into the hetero-junction interface of semiconductor substrate 104, before switching element 10 is turned ON after application of the gate voltage Vgs to switching element 10. Accordingly, switching device 1 of the present embodiment can suppress a phenomenon called a current collapse that the ON resistance of switching element 10 increases and a saturation value of the drain current Ids decreases due to application of a high voltage between drain electrode 12 and source electrode 13 of switching element 10.

Figure 7A:
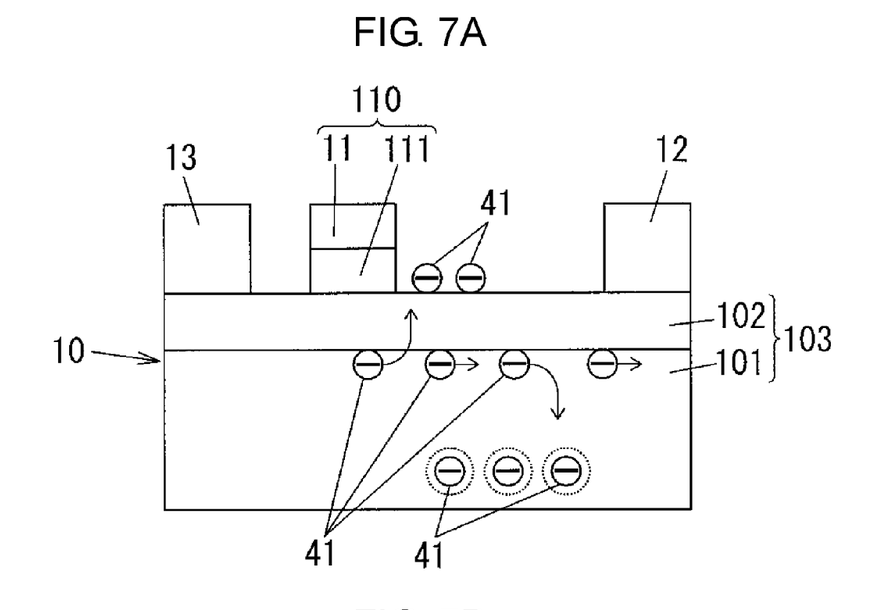
FIG. 7A is an explanatory diagram of a mechanism of a current collapse.
Figure 7B:
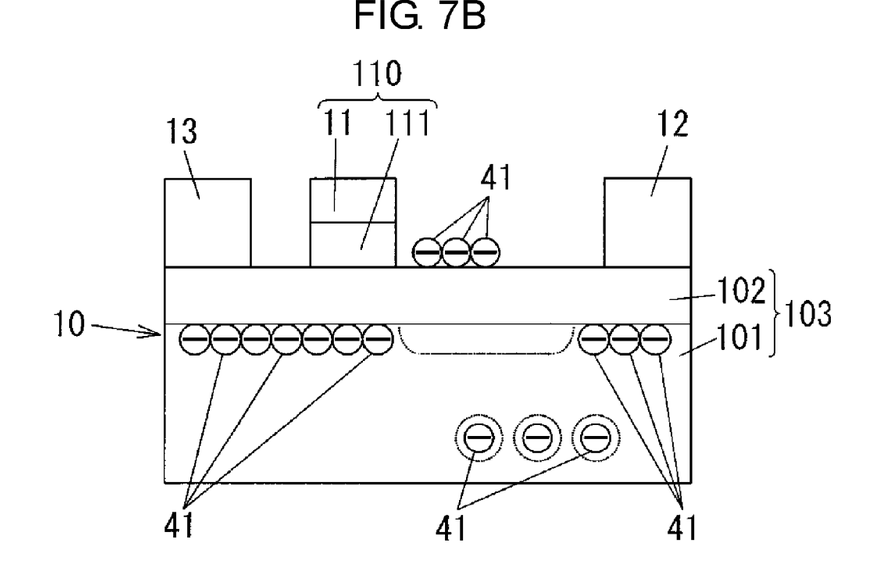
FIG. 7B is an explanatory diagram of the mechanism of the current collapse.

The current collapse is explained below with reference to FIGS. 7A and 7B. FIGS. 7A and 7B schematically show switching element 10 in an OFF state without application of the gate voltage Vgs.

In this state, when the drain voltage Vds at a high voltage (about 100 V, for example) is applied between drain electrode 12 and source electrode 13, switching element 10 has a strong electric field applied in concentration to an end part at a high-potential side (at a drain electrode 12 side) of gate unit 110. This electric field accelerates electrons in the 2-dimensional electron gas, and accelerated electrons 41 are trapped by crystal defects in semiconductor-stacked body 103 and the like, as shown in FIG. 7A. As a result, switching element 10 has an occurrence of electron traps between mainly gate unit 110 and drain electrode 12, and concentration of the 2-dimensional gas as the channel region decreases, as shown in FIG. 7B.

Thereafter, in switching element 10, trapped electrons 41 are released when a portion between drain electrode 12 and source electrode 13 becomes in the conductive state by application of the gate voltage Vgs. However, it sometimes takes time to release electrons 41. In this case, in switching element 10, electrons 41 that are kept being trapped even in the ON state narrow the channel region, and the drain current Ids does not sufficiently increase. This is considered to be the reason for the occurrence of the current collapse. Therefore, in switching element 10, once the high voltage is applied between drain current 12 and source electrode 13, it sometimes occurs thereafter that the ON resistance increases and the drain current Ids decreases.

On the other hand, according to switching device 1 of the present embodiment, injection driving unit 22 injects holes by applying the injection voltage Vin in advance, during the reset period before switching element 10 is turned ON. Therefore, switching device 1 can compensate for the electrons of the 2-dimensional electron gas that decreased by the electron trap. That is, holes injected in advance before switching element 10 is turned ON pull electrons of equivalent amount of injected holes to the hetero-junction interface. As a result, the concentration of the 2-dimensional electron gas as the channel region becomes high, and the ON resistance of switching element 10 becomes small.

According to switching device 1 of the present embodiment explained above, the increase of the ON resistance attributable to the current collapse can be suppressed, by injection driving unit 22 that injects holes from hole injecting unit 140 before switching element 10 is turned ON.

The layout of hole injecting unit 140 can be suitably set as explained in the first embodiment. However, because hole injecting unit 140 corresponds to the electron trap between gate unit 110 and drain electrode 12, hole injecting unit 140 is disposed preferably at a position adjacent to gate unit 110 between gate unit 110 and drain electrode 12. When switching element 10 used in switching device 1 is in the dual-gate structure having a pair of gate units 110, hole injecting unit 140 are respectively disposed preferably at positions adjacent to gate units 110 between both gate units 110. When hole injecting unit 140 is disposed in this way, switching device 1 can efficiently remove the trapped electrons that become the cause of the current collapse, by injection driving unit 22 that injects holes from hole injecting unit 140.

Injection driving unit 22 may inject holes by applying the injection voltage Vin to injecting electrode 14 during the ON time of switching element 10 as in the first embodiment, as well as in the reset period before switching element 10 is turned ON. With this arrangement, switching device 1 has an advantage in that the ON resistance of switching element 10 be further minimized.

In the present embodiment, when switching element 10 used in switching device 1 is in a dual-gate structure having a pair of gate units 110, injection driving unit 22 may also use high-potential-side gate unit 110 out of the pair of gate units 110, for the hole injecting unit. That is, in switching element 10 of the dual-gate structure, injection driving unit 22 can suppress the increase of the ON resistance due to the current collapse, by applying the injection voltage Vin to high-potential-side gate unit 110 during the reset period before switching element 10 is turned ON. In this case, switching element 10 can have a simple configuration, as compared with the case of having the hole injecting unit provided separately from gate unit 110.

Other configurations and functions are similar to those in the first embodiment.

Third Exemplary Embodiment

Figure 8:
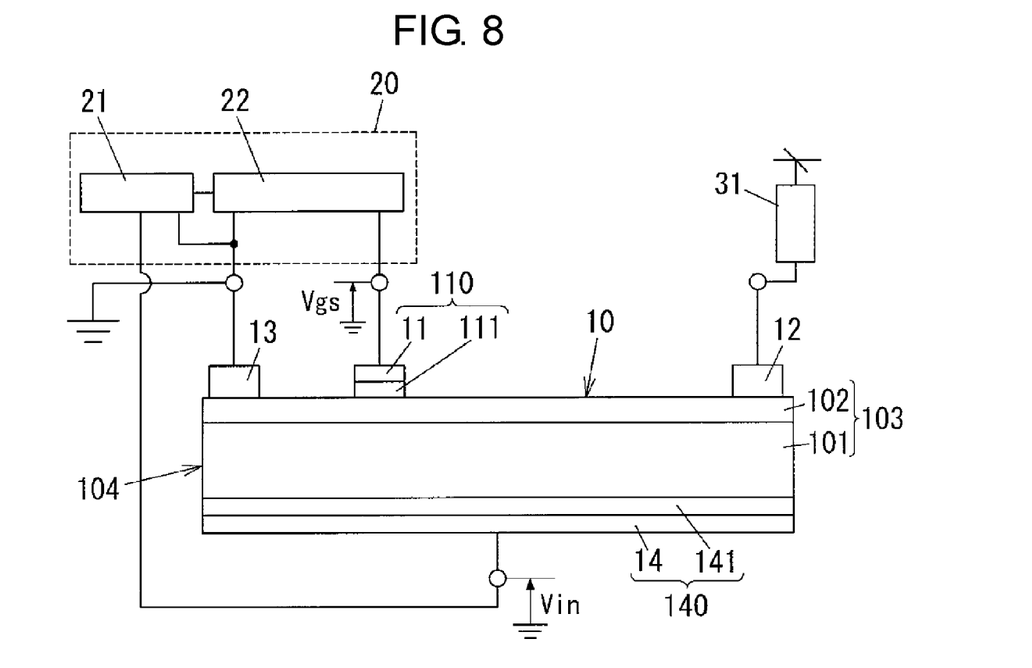
FIG. 8 is an explanatory diagram showing a schematic configuration of a switching device according to a third embodiment.

Switching device 1 of the present embodiment is different from switching device 1 of the first embodiment in that injecting electrode 14 of hole injecting unit 140 is provided on a surface (the other surface) at the opposite side of the one surface of semiconductor substrate 104 on which drain electrode 12 and the like are provided, as shown in FIG. 8. Hereinafter, configurations similar to those in the first embodiment are assigned with common marks, and their explanations are suitably omitted.

In the example of FIG. 8, the supporting substrate is omitted, and semiconductor substrate 104 consists of only semiconductor-stacked body 103 having second semiconductor layer 102 stacked on first semiconductor layer 101. Hole injecting unit 140 is formed on approximately a whole region on the surface of first semiconductor layer 101 that becomes the other surface of semiconductor substrate 104. Hole injecting unit 140 is configured by p-type semiconductor layer 141 stacked on first semiconductor layer 101, and injecting electrode 14 stacked on p-type semiconductor layer 141. In the present embodiment, p-type semiconductor layer 141 consists of an impurity-doped p-type GaN.

Figure 9:
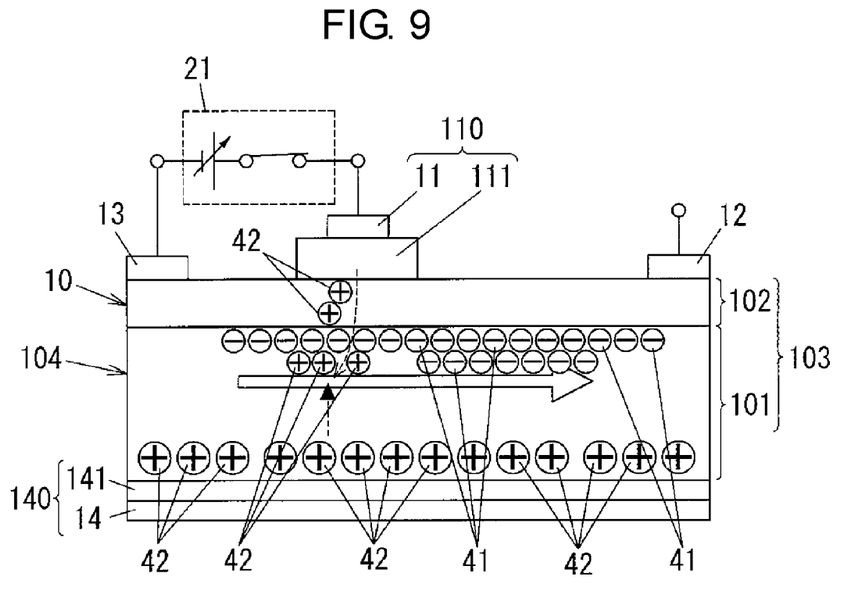
FIG. 9 is an explanatory diagram showing an operation of a switching element used in the switching device according to the third embodiment.

Switching device 1 of the above configuration has holes injected from a surface (the other surface) side of first semiconductor layer 101 into the hetero-junction interface as shown in FIG. 9, upon application of the injection voltage Vin between injecting electrode 14 and source electrode 13 by injection driving unit 22, during the ON time of switching element 10. That is, because the injected holes pull the equivalent amount of electrons to the hetero-junction interface as shown in FIG. 9, concentration of the 2-dimensional electron gas as the channel region becomes high, and the ON resistance of switching element 10 becomes small.

According to switching device 1 of the present embodiment described above, because the hole injecting unit is not necessary on the one surface of semiconductor substrate 104 on which drain electrode 12 and the like are provided, the layout of the hole injecting unit is little limited by the layout of drain electrode 12, source electrode 13, and gate unit 110. Therefore, there is an advantage in that a degree of freedom of the layout of the hole injecting unit becomes high.

In switching device 1 of the present embodiment, injection driving unit 22 may inject holes into injecting electrode 14 by applying the injection voltage Vin, during the reset period before switching element 10 is turned ON as in the second embodiment. In this case, the increase of the ON resistance attributable to the current collapse can be suppressed by injection driving unit 22 that injects the holes from hole injecting unit 140 before switching element 10 is turned ON.

In this case, injection driving unit 22 may inject the holes by applying the injection voltage Vin to injecting electrode 14 during the ON time of switching element 10 as in the first embodiment, as well as in the reset period before switching element 10 is turned ON. With this arrangement, switching device 1 has an advantage in that the ON resistance of switching element 10 can be further minimized.

Figure 10A:
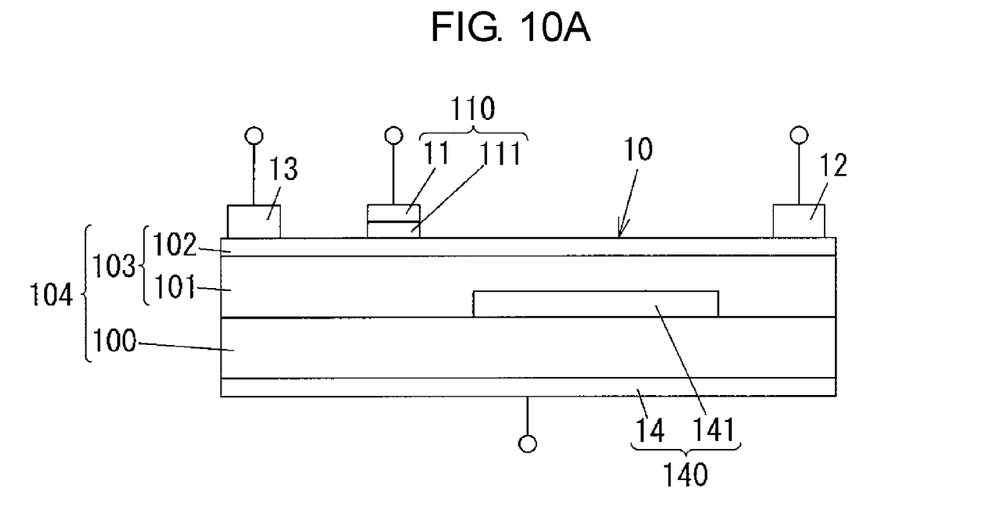
FIG. 10A is an explanatory diagram of other configuration of the switching element used in the switching device according the third embodiment.
Figure 10B:
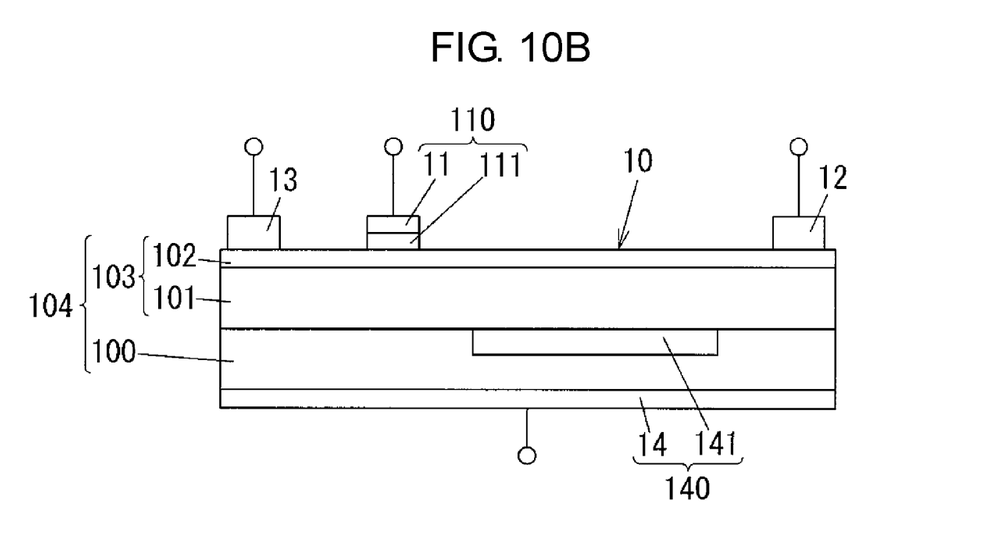
FIG. 10B is an explanatory diagram of other configuration of the switching element used in the switching device according the third embodiment.

Further, hole injecting unit 140 may be configured such that only injecting electrode 14 is provided on the surface of semiconductor substrate 104 and that p-type semiconductor layer 141 is embedded in semiconductor substrate 104, as shown in FIGS. 10A and 10B. In the example of FIG. 10A, semiconductor substrate 104 includes supporting substrate 100 made of silicon (Si), and p-type semiconductor layer 141 is formed by having an impurity doped in first semiconductor layer 101 stacked on supporting substrate 100, near an interface with supporting substrate 100. In the example of FIG. 10B, semiconductor substrate 104 includes supporting substrate 100 made of GaN, and p-type semiconductor layer 141 is formed by having an impurity doped in supporting substrate 100 near an interface with first semiconductor layer 101.

According to the configurations in FIGS. 10A and 10B, switching device 1 has the electric field applied to p-type semiconductor layer 141 in semiconductor substrate 104, based on the application of the injection voltage Vin between injecting electrode 14 and source electrode 13 by injection driving unit 22, and the holes are injected from p-type semiconductor layer 141 into the hetero-junction interface. In the examples of FIGS. 10A and 10B, p-type semiconductor layer 141 is formed between only gate unit 110 and drain electrode 12.

Figure 11:
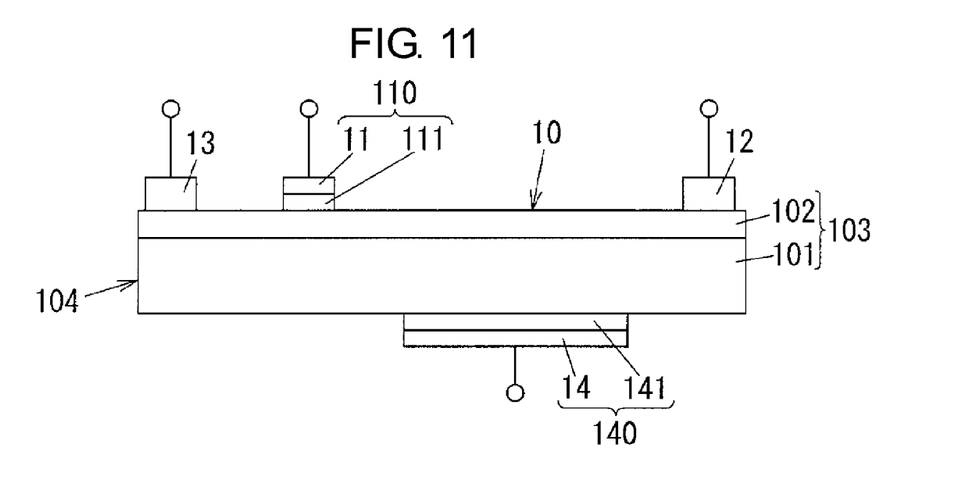
FIG. 11 is an explanatory diagram of other configuration of the switching element used in the switching device according the third embodiment.
Figure 12:
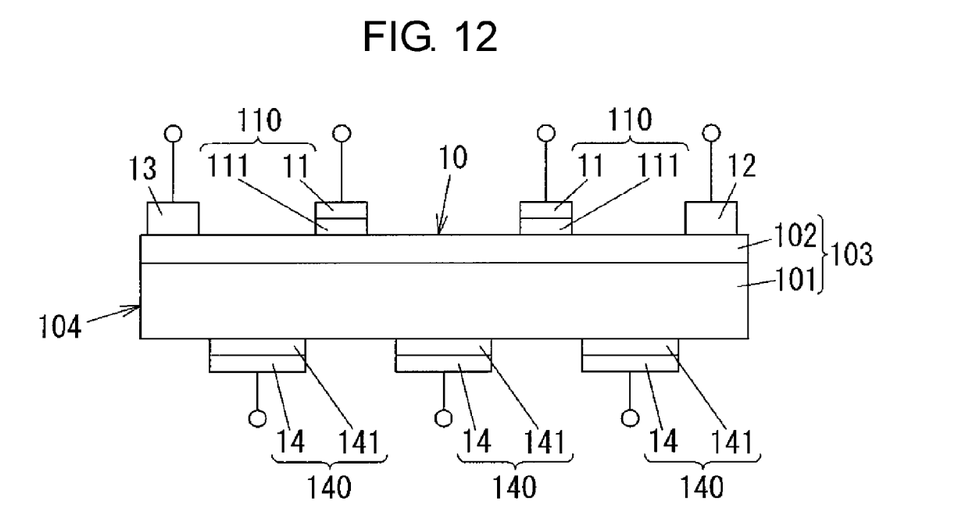
FIG. 12 is an explanatory diagram of other configuration of the switching element used in the switching device according the third embodiment.

Hole injecting unit 140 may be provided at a position excluding a position where hole injecting unit 140 is superposed with gate unit 110 in a thickness direction of semiconductor substrate 104, on the other surface of semiconductor substrate 104. That is, hole injecting unit 140 is disposed at a position corresponding to between drain electrode 12 and gate unit 110, as shown in FIG. 11, for example. Further, in switching element 10 of the dual-gate structure, hole injecting unit 140 is disposed as exemplified in FIG. 12, for example. In the example of FIG. 12, three hole injecting units 140 are provided, and hole injecting units 140 are disposed between gate electrode 110 and drain electrode 12 at one side, between gate electrode 110 and source electrode 13 at the other side, and between both gate electrodes 110, respectively, on first semiconductor layer 101.

Figure 13:
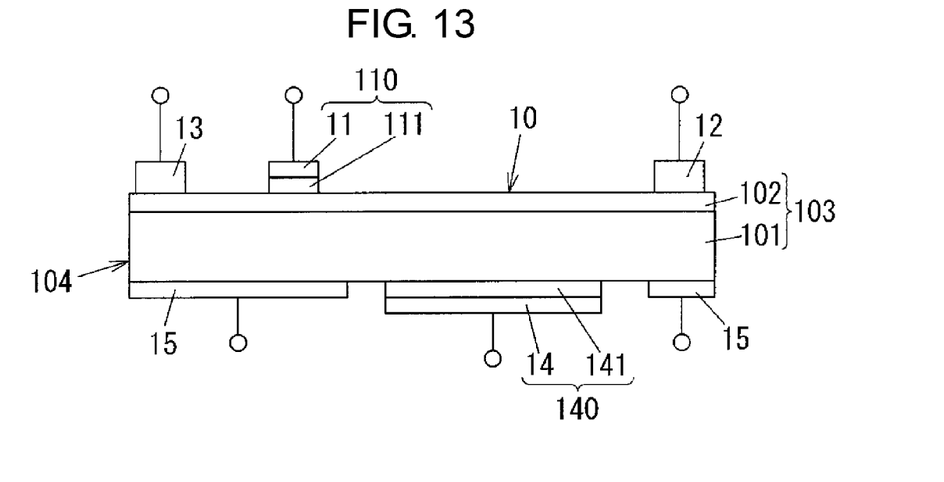
FIG. 13 is an explanatory diagram of other configuration of the switching element used in the switching device according the third embodiment.

As a further other example, on the other surface of semiconductor substrate 104, substrate electrode 15 that determines a potential of semiconductor substrate 104 may be provided separately from injecting electrode 14, as shown in FIG. 13. Substrate electrode 15 is an electrode for determining a potential of first semiconductor layer 101, and is normally connected to source electrode 13. Drive circuit 20 can change the threshold value of the gate voltage Vgs and can diminish the electric charge remaining in semiconductor substrate 104 at an early stage, for example, by changing the bias to be applied to substrate electrode 15.

Other configurations and functions are similar to those in the first embodiment.

What is claimed is:

1. A switching device comprising:
   a switching element that has a semiconductor substrate, a first electrode and a second electrode disposed on one surface of the semiconductor substrate, and a gate unit disposed between the first electrode and the second electrode on the one surface, and that makes a portion between the first electrode and the second electrode conductive by forming a channel region on the semiconductor substrate when a gate voltage exceeding a predetermined threshold voltage is applied to the gate unit; and
   a drive circuit that switches between ON and OFF of the switching element by applying the gate voltage to the gate unit of the switching element, wherein
   the semiconductor substrate includes a semiconductor-stacked body formed by having a first semiconductor layer and a second semiconductor layer stacked, has a hetero junction interface at a junction portion between the first semiconductor layer and the second semiconductor layer, and uses a 2-dimensional electron gas layer generated in the hetero junction interface as the channel region,
   the switching element has a hole injecting unit that includes an injecting electrode directly connected to the semiconductor substrate,
   the drive circuit has an injection driving unit that injects holes from the hole injecting unit into the hetero junction interface by applying an injection voltage to the injecting electrode, and
   the hole injection unit is disposed at a position between the first electrode and the gate unit, or between the gate unit and the second electrode.

2. The switching device according to claim 1, wherein the injection driving unit injects holes into the hetero junction interface by applying the injection voltage to the injecting electrode, during an ON time of the switching element.

3. The switching device according to claim 2, wherein the drive circuit has a voltage monitoring unit that measures a voltage applied between the first electrode and the second electrode of the switching element, as a device voltage, and
the injection driving unit adjusts a magnitude of the injection voltage according to a measured value of the voltage monitoring unit.

4. The switching device according to claim 1, wherein the injection driving unit injects holes into the hetero junction interface by applying the injection voltage to the injecting electrode, during a reset period that is set before a time point when the switching element is turned ON.

5. The switching device according to claim 1, wherein the injecting electrode is provided on the other surface at the opposite side of the one surface of the semiconductor substrate.

6. The switching device according to claim 5, wherein the injecting electrode is disposed at a position of the other surface excluding a position at which the injecting electrode is superposed with the gate unit in a thickness direction of the semiconductor substrate.

7. The switching device according to claim 5, wherein the other surface of the semiconductor substrate is provided with a substrate electrode that determines a potential of the semiconductor substrate, separately from the injecting electrode.

8. The switching device according to claim 1, wherein the hole injecting unit is disposed between a high-potential-side electrode out of the first electrode and the second electrode, and the gate unit.

9. The switching device according to claim 1, wherein the hole injecting unit has a p-type semiconductor layer.

10. The switching device according to claim 1, wherein the injection driving unit has an insulation-type power supply circuit of which a portion between an input end and an output end is electrically insulated, and applies the injection voltage, from the output end of the power supply circuit to the injecting electrode, following an injection signal that is applied to the input end of the power supply circuit.

11. A switching device comprising:
    a switching element that has a semiconductor substrate, a first electrode and a second electrode disposed on one surface of the semiconductor substrate, and a gate unit disposed between the first electrode and the second electrode on the one surface, and that makes a portion between the first electrode and the second electrode conductive by forming a channel region on the semiconductor substrate when a gate voltage exceeding a predetermined threshold voltage is applied to the gate unit; and a drive circuit that switches between ON and OFF of the switching element by applying the gate voltage to the gate unit of the switching element, wherein the semiconductor substrate includes a semiconductor-stacked body formed by having a first semiconductor layer and a second semiconductor layer stacked, has a hetero-junction interface at a junction portion between the first semiconductor layer and the second semiconductor layer, and uses a 2-dimensional electron gas layer generated in the hetero junction interface as the channel region, the switching element has a hole injecting unit that includes an injecting electrode directly connected to the semiconductor substrate, the drive circuit has an injection driving unit that injects holes from the hole injecting unit into the hetero junction interface by applying an injection voltage to the injecting electrode, the injection driving unit injects holes into the hetero-junction interface by applying the injection voltage to the injecting electrode, during a reset period that is set before a time point when the switching element is turned ON, the switching element has a pair of the gate units, and the injection driving unit uses a high-potential-side gate unit out of the pair of gate units, for the hole injecting unit.

12. A switching device comprising:

a switching element that has a semiconductor substrate, a first electrode and a second electrode disposed on one surface of the semiconductor substrate, and a gate unit disposed between the first electrode and the second electrode on the one surface, and that makes a portion between the first electrode and the second electrode conductive by forming a channel region on the semiconductor substrate when a gate voltage exceeding a predetermined threshold voltage is applied to the gate unit; and a drive circuit that switches between ON and OFF of the switching element by applying the gate voltage to the gate unit of the switching element, wherein the semiconductor substrate includes a semiconductor-stacked body formed by having a first semiconductor layer and a second semiconductor layer stacked, has a hetero-junction interface at a junction portion between the first semiconductor layer and the second semiconductor layer, and uses a 2-dimensional electron gas layer generated in the hetero junction interface as the channel region, the switching element has a hole injecting unit that includes an injecting electrode directly connected to the semiconductor substrate, the drive circuit has an injection driving unit that injects holes from the hole injecting unit into the hetero junction interface by applying an injection voltage to the injecting electrode, and the hole injecting unit is provided in a plurality of number.

13. A switching device comprising:

a switching element that has a semiconductor substrate, a first electrode and a second electrode disposed on one surface of the semiconductor substrate, and a gate unit disposed between the first electrode and the second electrode on the one surface, and that makes a portion between the first electrode and the second electrode conductive by forming a channel region on the semiconductor substrate when a gate voltage exceeding a predetermined threshold voltage is applied to the gate unit; and a drive circuit that switches between ON and OFF of the switching element by applying the gate voltage to the gate unit of the switching element, wherein the semiconductor substrate includes a semiconductor-stacked body formed by having a first semiconductor layer and a second semiconductor layer stacked, has a hetero-junction interface at a junction portion between the first semiconductor layer and the second semiconductor layer, and uses a 2-dimensional electron gas layer generated in the hetero junction interface as the channel region, the switching element has a hole injecting unit that includes an injecting electrode directly connected to the semiconductor substrate, the drive circuit has an injection driving unit that injects holes from the hole injecting unit into the hetero junction interface by applying an injection voltage to the injecting electrode, and the gate unit is provided in a pair, and the hole injecting unit is disposed between the pair of gate units.

* * * * *